United States Patent [19]

Sunami et al.

[11] Patent Number: 4,656,492
[45] Date of Patent: Apr. 7, 1987

[54] INSULATED GATE FIELD EFFECT TRANSISTOR

[75] Inventors: Hideo Sunami, Nishitama; Hiroo Masuda, Kodaira; Yoshiaki Kamigaki, Nerima; Katsuhiro Shimohigashi, Musashimurayama; Eiji Takeda, Koganei, all of Japan

[73] Assignee: Hitachi, Ltd., Tokyo, Japan

[21] Appl. No.: 786,715

[22] Filed: Oct. 15, 1985

Related U.S. Application Data

[63] Continuation of Ser. No. 408,805, Aug. 17, 1982, abandoned.

[30] Foreign Application Priority Data

Aug. 24, 1981 [JP] Japan .................................. 56-131521

[51] Int. Cl.[4] ...................... H01L 29/76; H01L 29/78; H01L 29/94
[52] U.S. Cl. .................................. 357/23.3; 357/23.4; 357/23.5; 357/23.8
[58] Field of Search ...... 357/23 HV, 23 VD, 23 MG, 357/23 VT, 23 SC, 23 D

[56] References Cited

U.S. PATENT DOCUMENTS

| | | | |
|---|---|---|---|
| 3,631,312 | 12/1971 | Moyle et al. | 357/23 HV |
| 4,028,717 | 6/1977 | Joy et al. | 357/23 D |
| 4,070,687 | 1/1978 | Ho et al. | 357/23 HV |
| 4,078,947 | 3/1978 | Johnson et al. | 357/23 D |
| 4,212,683 | 7/1980 | Jones et al. | 357/23 |
| 4,242,691 | 12/1980 | Kotoni et al. | 357/23 |
| 4,276,095 | 6/1981 | Beilstein, Jr. et al. | 357/23 D |
| 4,306,352 | 12/1981 | Schrader | 357/23 |

FOREIGN PATENT DOCUMENTS 0084571  7/1978  Japan .............................. 357/23 SC

OTHER PUBLICATIONS

"Design and Characteristics of the Lightly Doped Drain-Source (LDD) Insulated Gate Field-Effect Transister", Ogura et al., *IEEE Transactions on Electron Devices*, vol. ed-27, No. 8, Aug. 1980, pp. 1359-1367.
"Threshold-Sensitivity Minimization of Short-Channel Mosfet's by Computer Simulation", Yokoyama et al., *IEEE Transactions on Electron Devices*, vol. ED-27, No. 8, Aug. 1980, pp. 1509-1514.

Primary Examiner—Martin H. Edlow
Assistant Examiner—S. V. Clark
Attorney, Agent, or Firm—Antonelli, Terry & Wands

[57] ABSTRACT

An insulated gate field effect transistor is formed in one surface of a semiconductor substrate. The surface portion of a channel has an impurity distribution of the conduction type opposite to that of the substrate, which the deeper portion of the channel has an impurity distribution of the same conduction type as that of the substrate. Moreover, at least one of a source and a drain is formed of such an impurity layer of the conduction type opposite to that of the substrate as has its impurity distribution gently sloped by double diffusion processes.

6 Claims, 6 Drawing Figures

INSULATED GATE FIELD EFFECT TRANSISTOR

This application is a continuation of application Ser. No. 408,805 filed Aug. 17, 1982 abandoned.

BACKGROUND OF THE INVENTION

1. Field of the Invention

The present invention relates to an insulated gate field effect transistor and, more particularly, to a transistor structure which has its short-channel effect depressed to improve the source-to-drain breakdown voltage and the controllability of a threshold voltage so that it can be suitably used in an LSI having a high integration density.

2. Description of the Prior Art

In the insulated gate field effect transistor of the prior art, especially, in an MOS transistor, it is a current practice to form an impurity layer of the same conduction type as that of a substrate by a method of implanting ions into the surface region of a channel so as to raise a threshold voltage $V_{th}$ thereby to provide an enhancement type device. The MOS transistor of this type (which is called the "surface type") has its defect in that the so-called "short-channel effect" is high, e.g., in that the dependency of the threshold voltage $V_{th}$ upon the gate length is high and in that the source-to-drain breakdown voltage is low.

As the MOS transistor which has succeeded in eliminating that defect, i.e., in depressing the short-channel effect, there is known a transistor which has a higher impurity distribution in a higher region of a channel. This impurity layer formed in the deeper position is called the "punch-through stopper". More specifically, since the aforementioned surface type MOS transistor has its impurity layer existing in the surface of the channel portion, a depletion layer is liable to be formed in a deeper region than that impurity layer, and the depletion layer to extend from the drain is made liable to extend in that deeper region thereby to reach the source by the action of a voltage $V_D$ applied to the drain. Therefore, the depression of the elongation of the depletion layer in that region belongs to the function of the punch-through stopper.

As a result, the short channel effect is depressed, but the breakdown voltage of the drain junction is lowered as an adverse effect together with the source-to-drain breakdown voltage as a result of the fact that the impurity density in the vicinity of the drain is increased. Moreover, only the punch-through stopper finds it difficult to control the threshold voltage $V_{th}$.

In any transistor having the channel portion of the construction thus far described, since carriers are allowed to move within a limited region of the surface of the channel portion, the carrier mobility takes a relatively low value.

SUMMARY OF THE INVENTION

It is, therefore, an object of the present invention to provide an insulated gate field effect transistor having such a novel construction as can depress the short-channel effect and raise the breakdown voltage.

Another object of the present invention is to provide an insulated gate field effect transistor which is enabled to have an enlarged carrier mobility.

A feature of the present invention resides in that an insulated gate field effect transistor composed of a semiconductor substrate, a gate insulating film, a gate and a source and/or drain has an impurity distribution of the conduction type opposite to that of the substrate in the vicinity of the surface of the semiconductor substrate and an impurity distribution of the same conduction type as that of the substrate in a deeper portion, and in that the source and/or drain have a gently sloped impurity distribution.

Thanks to the punch-through stopper formed by the impurity distribution of the same conduction as that of the substrate, more specifically, the short channel effect is depressed, and an impurity of the conduction opposite to that of the substrate is introduced into the vicinity of the Si surface so that carriers acting as a current to be injected from the source are made to flow closer to the substrate than the surface type transistor thereby to achieve the improvement in the carrier mobility and the control of the threshold voltage $V_{th}$.

In order to prevent the reduction in the breakdown voltage of the drain junction due to the formation of the punch-through stopper, on the other hand, the gradient of the impurity density in the vicinity of the drain is so gently sloped as to make the electric field at the drain end gentle.

DESCRIPTION OF THE PREFERRED EMBODIMENTS

Figure 1:
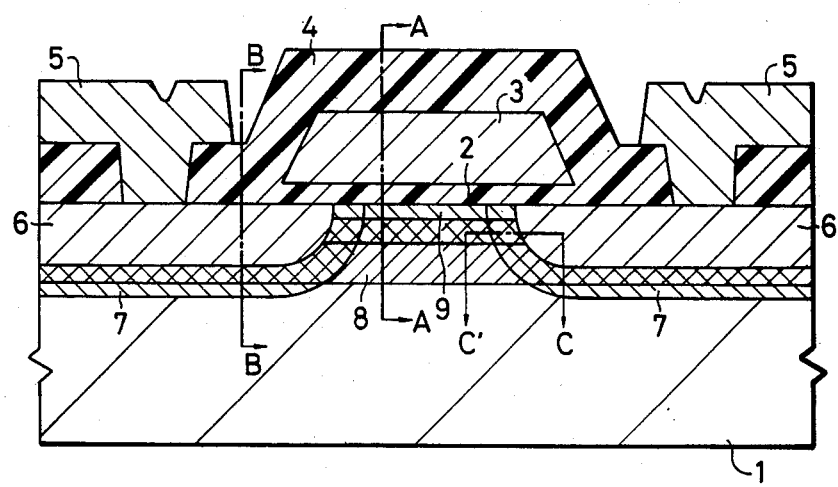
FIG. 1 is a view showing an insulated gate field effect transistor according to an embodiment of the present invention.

The present invention will be described in the following in connection with one embodiment thereof with reference to FIG. 1. For convenience only, the following description will be made by taking an n-channel MOS transistor as an example.

An Si substrate 1 is prepared to have a resistivity of about 10 Ωcm as a result that boron (B) is added in a density of $1 \times 10^{15}$ cm$^{-3}$. The Si substrate 1 thus prepared is oxidized with dry oxygen to form a gate oxide film 2 having a thickness of 5 to 100 nm. After this, boron (B) is usually ion-implanted at a voltage of 50 to 300 KeV so that a peak is established in the substrate 1, as shown in FIG. 2 (which is a section taken along line A—A of FIG. 1). The boron distribution takes such a shape after a heat treatment as is indicated at 11 in FIG. 2. The depth of the peak is about 0.4 μm at the voltage of 150 KeV. Since, in this case, the impurity density 10 of the substrate is $1 \times 10^{15}$ cm$^{-3}$, the effectiveness is started if the peak density 11 of the boron (B) implanted to form a p-type layer 8 substantially exceeds $2 \times 10^{15}$ cm$^{-3}$. As a result, the dose is equal to or higher than $1 \times 10^{11}$ cm$^{-2}$.

In order to form an n-type layer 9 having the conduction type opposite to that of the substrate, an impurity represented by arsenic (As) or phosphorous (P) is then ion-implanted to have a distribution indicated at 12 in FIG. 2. The implantation energy is usually 30 to 100 KeV although it is different for the thickness of the gate oxide film or the kind of the ions. The dose is determined to attain a desired threshold voltage $V_{th}$, while offsetting the dose of the boron having been implanted in advance, and may be about $1\times10^{11}$ cm$^{-2}$ although it cannot be determined by itself. Although, in this case, the boron (B) is ion-implanted prior to the arsenic (As) or phosphorous (P), it may be implanted thereafter.

Figure 3:
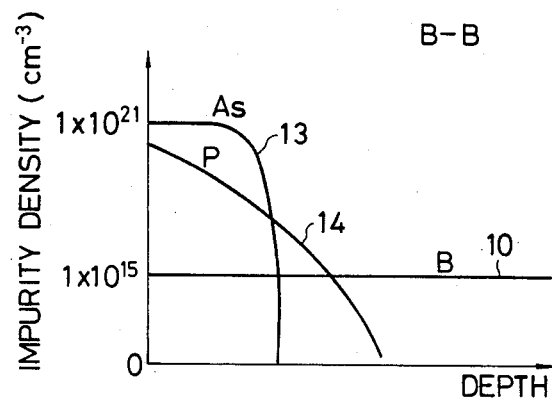
Figure 4:
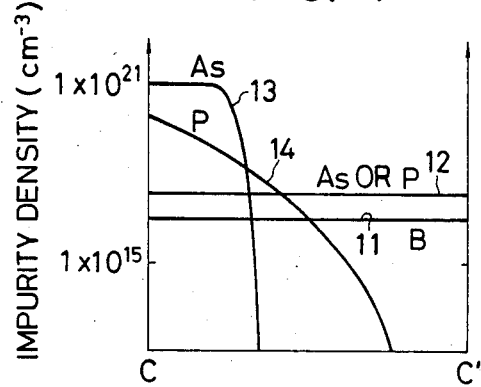

After that, a gate 3 made of a material which is represented by polycrystalline Si, Mo, W or the like is selected for covering, and the arsenic (As) is ion-implanted all over the surface. The dose is about $1\times10^{16}$ cm$^{-2}$. The arsenic (As) is preferably used because it can form an n$^+$-type layer 6 having a shallow junction and a low resistance, although it has such a steep distribution as is indicated at 13 in FIG. 3 (which is a section taken along line B—B of FIG. 1) so that it has a lower source-to-drain breakdown voltage than that of the phosphorous (P). In order to depress the reduction in the breakdown voltage due to the steep distribution, however, according to the present invention, the phosphorous (P) is further implanted in a dose of $1\times10^{15}$ to $5\times10^{16}$ cm$^{-2}$ thereby to form a P-diffusion layer 7 of n-type, which is realized to have such a distribution as is indicated at 14 in FIG. 3. Since the phosphorous (P) has a faster diffusion rate than the arsenic (As), that P distribution 14 is usually allowed to exceed the leading end of the As distribution 13 by the heat treatment at 1000° C. for about 30 minutes so that the excess portion is so gently sloped as is illustrated in FIGS. 3 and 4. The resultant gently sloped portion damps the intensity of the electric field thereby to improve the source-to-drain breakdown voltage. FIG. 4 is a section taken along line C—C of FIG. 1.

In order to effect the gentleI slope only, it is sufficient to make all the portions of the source and drain 6 and 7 of the phosphorous (P). If, in this case, the depth Xj of the source-drain junction is 0.3 μm, the sheet resistance ρs becomes as high as 100Ω/□. If the junction having the thickness of Xj=0.3 μm is made of the arsenic (As), the sheet resistance ρs is reduced to 2.5 Ω/□ so that the effect resulting from the use of the arsenic (As) is remarkably high. Thus, there is a tendency that the ratio of the sheet resistance ρs is enlarged to a greater extent for the lower depth Xj.

After that, an insulating film 4 which is made by the CVD method of a material represented by phospho-silicate glass (PSG) is selected for covering, and a connecting electrode 5 of aluminum (Al) for the source-drain 6 is selected for covering, thus constructing the desired MOS transistor.

Figure 5:
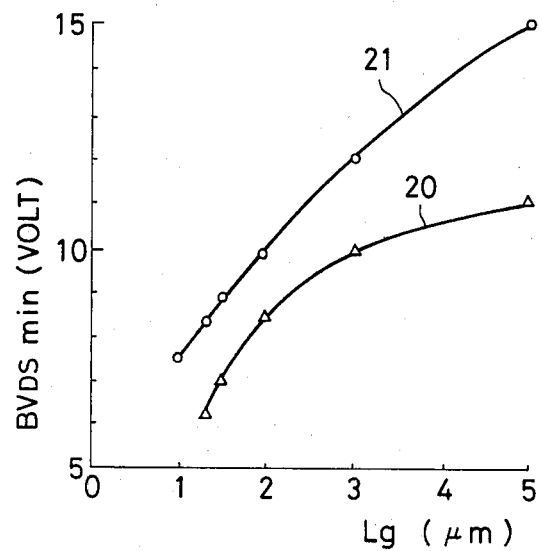
FIG. 5 is a graph illustrating a portion of the characteristics of the embodiment of FIG. 1.

In the embodiment of the present invention thus far described, the characteristics of the minimum source-to-drain breakdown voltage BV$_{DS.min}$ for the gate length Lg take such a behavior as is plotted in FIG. 5, in case the thickness of the oxide film is 35 nm and Xj=0.3 μm. A curve 20 plots the characteristics of the conventional surface type MOS transistor for comparing purpose, whereas a curve 21 plots the characteristics of the MOS transistor according to the embodiment thus far described.

As is apparent from FIG. 5, the embodiment under description is far more excellent in the source-to-drain breakdown voltage than the conventional surface type MOS transistor so that it can easily provide a small-sized short-channel MOS transistor.

Figure 6:
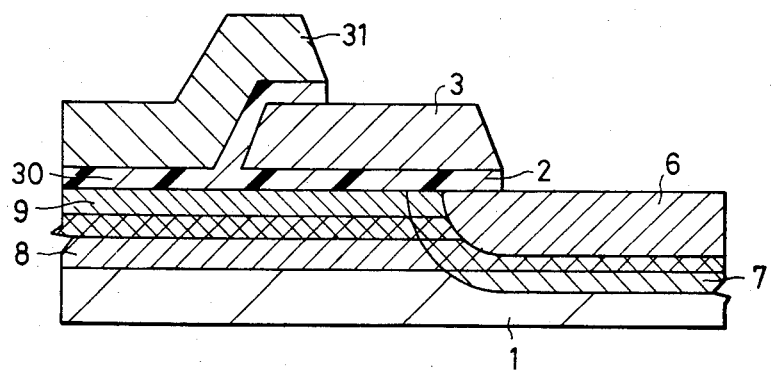
FIG. 6 is a view showing an insulated gate field effect transistor according to another embodiment of the present invention.

FIG. 6 is a sectional view showing another embodiment of the present invention. In this embodiment, the impurity diffusion layer for providing the source region is omitted, and a second gate 31 is provided in place thereof to overlie the substrate through a second gate insulating film 30.

Figure 2:
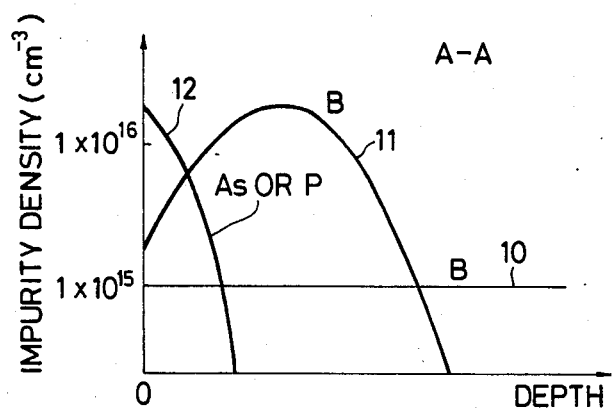
FIGS. 2 to 4 are graphs illustrating the impurity density distributions of the embodiment shown in FIG. 1.

The formation of the drain and the introduction of the impurity into the channel are conducted absolutely in similar manners to those of the foregoing embodiment of FIG. 1. Therefore, the boron (B) is ion-implanted into the channel region so that its peak falls at a portion having a depth of about 0.4 μm, thus forming the p-type layer 8. Moreover, the arsenic (As) or phosphorous (P) is implanted into the portion closer to the surface, thus forming the n-type layer 9. On the other hand, the drain 6 is formed by the double diffusions of the arsenic (As) and the phosphorous (P). This embodiment can be deemed as a MOS transistor in which the surface region of the Si substrate facing the second gate is used as the gate. The impurity density of the region providing the source is not different from that of the channel region. This embodiment can also be said to provide an excellent structure in the depression of the short channel effect and in the improvement in the source-to-drain breakdown voltage similarly to the foregoing embodiment of FIG. 1.

As has been described hereinbefore, according to the present invention, the source-to-drain breakdown voltage can be raised without deteriorating the short-channel effect. This also leads to the reduction in the channel hot electrons and to the improvement in the DC stress breakdown voltage. In other words, the shorter channel can be made possible, for an identical source-to-drain breakdown voltage thereby to remarkably enhance the performance of the transistor.

On the other hand, the impurity implanted into the surface and having the conduction type opposite to that of the substrate has a function to damp the electric field in the depth direction of the channel (i.e., in the direction toward the inside of the substrate) thereby to improve the effective carrier mobility. This improvement is found to be about 30% in the embodiments thus far described. This also enhances the capacity of the transistor and is advantageous for the higher performance together with the improvement in the source-to-drain breakdown voltage.

Although the N-channel type MOS transistor has heretofore been used for the description of the present invention, this invention can be realized absolutely similarly for the P-channel type transistor if the impurity is of the opposite conduction type. In this modification, however, since the P-channel transistor uses an impurity such as B, Ga or Al in the source and drain, the slopes become substantially gentle, because the impurity has a fast diffusion rate, thus making it unnecessary to doubly add different kinds of impurities to the source and drain regions, as is different from FIG. 1.

What is claimed is:

1. An insulated gate field effect transistor comprising:
    a semiconductor substrate of a first conduction type;
    a gate electrode formed over a predetermined channel region in the surface region overlying said semiconductor substrate; and
    a gate insulating film lying between said gate electrode and said semiconductor substrate;
    at least one of source and drain regions adjacent to said channel region comprising:
        a first impurity layer of a second conduction type and of a first predetermined depth, said first impurity layer having a first peak density and first impurity slope distribution of impurity values across said first predetermined depth of said first impurity layer, wherein said first impurity layer is formed with an impurity having a first impurity diffusion rate, and a second impurity layer of the second conduction type and of a second predetermined depth, said second impurity layer having a second peak density and a second impurity slope distribution of impurity values across said second predetermined depth of said second impurity layer, wherein said second impurity layer is formed with an impurity having a second impurity diffusion rate which is greater than the first impurity diffusion rate, wherein said second predetermined depth is greater than said first predetermined depth, wherein said first peak density is greater than said second peak density, and wherein said first impurity slope distribution is steeper than said second impurity slope distribution, and wherein said channel region has a first impurity distribution of the second conduction type lying in the vicinity of the surface of said semiconductor substrate and a second impurity distribution of the first conduction type and lying deeper in said substrate than said first impurity distribution, a concentration of said second impurity distribution being greater than an impurity concentration of said substrate.

2. In insulated gate field effect transistior as set forth in claim 1, wherein said second impurity distribution has its peak impurality density value located inside of said semiconductor substrate.

3. An insulated gate field effect transistor as set forth in claim 1, wherein said second impurity distribution is at least as deep as said one of source and drain regions.

4. An insulated gate field effect transistor as set forth in claim 1, wherein said first impurity layer is formed by the diffusion of arsenic whereas said second impurity layer is formed by the diffusion of phosphorous.

5. An insulated gate field effect transistor as set forth in claim 1, wherein said drain region is formed of said first and second impurity layers, and further comprising a second gate electrode formed over said source region, and a second gate insulating film lying between said second gate electrode and said source region.

6. An insulated gate field effect transistor as set forth in claim 5, wherein said source region has the same impurity distrubution as that of said channel region.

* * * * *